United States Patent
Han et al.

(10) Patent No.: US 10,495,923 B2
(45) Date of Patent: Dec. 3, 2019

(54) BACKLIGHT MODULE AND LIQUID CRYSTAL DISPLAY

(71) Applicant: WUHAN CHINA STAR OPTOELECTRONICS TECHNOLOGY CO., LTD, Wuhan, Hubei (CN)

(72) Inventors: Mei Han, Hubei (CN); Qing Guo, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/577,033

(22) PCT Filed: Aug. 31, 2017

(86) PCT No.: PCT/CN2017/099875
§ 371 (c)(1),
(2) Date: Nov. 27, 2017

(87) PCT Pub. No.: WO2019/019253
PCT Pub. Date: Jan. 31, 2019

(65) Prior Publication Data
US 2019/0025646 A1    Jan. 24, 2019

(30) Foreign Application Priority Data
Jul. 24, 2017 (CN) .......................... 2017 1 0605752

(51) Int. Cl.
*G02F 1/13357* (2006.01)
*G02F 1/1335* (2006.01)
(Continued)

(52) U.S. Cl.
CPC ..... *G02F 1/133603* (2013.01); *G02B 6/0003* (2013.01); *G02B 6/0043* (2013.01);
(Continued)

(58) Field of Classification Search
CPC ... G02F 1/133617; G02F 2001/133614; G02B 6/0003
(Continued)

(56) References Cited

U.S. PATENT DOCUMENTS 6,637,905 B1 * 10/2003 Ng ...................... G02B 6/0026
362/601
9,167,659 B2 * 10/2015 Coe-Sullivan ........ H01L 33/502
(Continued)

FOREIGN PATENT DOCUMENTS

CN    102330914 A    1/2012
CN    103102075 A    5/2013
(Continued)

*Primary Examiner* — Christopher M Raabe
(74) *Attorney, Agent, or Firm* — Mintz Levin Cohn Ferris Glovsky and Popeo, P.C.; Jhongwoo Peck

(57) ABSTRACT

The present disclosure provides a backlight module, which includes: a transparent light guiding body having a light incidence side surface and a sealed accommodating cavity; a plurality of quantum dots accommodated in the accommodating cavity; and a light source disposed adjacent to the light incidence side surface. The present disclosure also provides a liquid crystal display having the backlight module. The present disclosure prevent the quantum dot material from being affected by moisture and oxygen by sealing the quantum dot materials using glass flat plates, thereby facilitating the display of the liquid crystal display.

12 Claims, 2 Drawing Sheets

(51) Int. Cl.
*F21V 8/00* (2006.01)
*H01L 27/12* (2006.01)

(52) U.S. Cl.
CPC ..... *G02B 6/0088* (2013.01); *G02F 1/133514* (2013.01); *G02F 1/133605* (2013.01); *H01L 27/1214* (2013.01); *G02B 6/0055* (2013.01); *G02F 2001/133614* (2013.01)

(58) Field of Classification Search
USPC ........................................................ 362/97.2
See application file for complete search history.

(56) References Cited

U.S. PATENT DOCUMENTS

| | | | | |
|---|---|---|---|---|
| 2006/0268571 | A1* | 11/2006 | Harada | G02B 6/0038 362/607 |
| 2011/0176328 | A1* | 7/2011 | Anandan | G02B 6/0036 362/606 |
| 2012/0075837 | A1* | 3/2012 | Um | G02B 6/0023 362/84 |
| 2013/0114301 | A1* | 5/2013 | Um | G02B 6/0023 362/621 |
| 2015/0268402 | A1 | 9/2015 | An et al. | |
| 2016/0238774 | A1* | 8/2016 | Koike | G02B 6/0043 |
| 2017/0017021 | A1* | 1/2017 | Tokinoya | G02B 6/005 |
| 2017/0102496 | A1* | 4/2017 | Yeo | G02B 6/002 |
| 2018/0095329 | A1* | 4/2018 | Shimizu | F21S 2/00 |

FOREIGN PATENT DOCUMENTS

| | | |
|---|---|---|
| CN | 103869536 A | 6/2014 |
| CN | 104081264 A | 10/2014 |
| CN | 104793284 A | 7/2015 |
| CN | 105114867 A | 12/2015 |
| CN | 105204216 A | 12/2015 |
| CN | 105810796 A | 7/2016 |
| CN | 205575624 U | 9/2016 |
| CN | 106784236 A | 5/2017 |
| JP | 2017-16925 A | 1/2017 |
| KR | 20120075049 A | 7/2012 |

\* cited by examiner

BACKLIGHT MODULE AND LIQUID CRYSTAL DISPLAY

CROSS-REFERENCE TO RELATED APPLICATIONS

This application is a U.S. national phase application, pursuant to 35 U.S.C. § 371, of PCT/CN2017/099875, filed Aug. 31, 2017, designating the United States, which claims priority to Chinese Application No. 201710605752.4, filed Jul. 24, 2017. The entire contents of the aforementioned patent applications are incorporated herein by this reference.

TECHNICAL FIELD

The present disclosure belongs to a technical field of a liquid crystal display, and particularly, relates to a backlight module and a liquid crystal display having the same.

RELATED ART

With the development of photoelectric and semiconductor technologies, a flat plate display has been developed rapidly. Among various flat plate displays, a liquid crystal display (LCD) has been applied to all aspects in production and life since it has numerous advantages, such as high space utilization efficiency, low power consumption, free of radiation and low electromagnetic interference.

In the existing liquid crystal display, a white light emitting diode (LED) is usually used as a backlight source. With the increasing requirements on high color gamut, high color saturation and the like, current solutions for realizing white light, high color gamut and high color saturation in the backlight include: ultraviolet LED with RGB fluorophor power; blue light LED with red and green fluorophor power; and blue light LED with green light LED and red light LED, and the like. These solutions all can improve the color gamut, but it is relatively difficult to implement them, and the cost is relatively high.

Quantum dot (QD) technology is a semiconductor nano material structure technology which bounds electrons within a certain range, which is formed by ultra-small compound crystals having sizes from 1 nm to 100 nm. In the quantum dot technology, crystals having different sizes may be used to control a wavelength of the light, thereby accurately controlling a color of the light, thus, the quantum dot technology is widely applied to a backlight module. In the backlight module using the quantum dot technology, the quantum dot materials is irradiated with a light source having a high spectrum (for example, the blue light LED), which may excite to generate light with different wavelengths, and the color of the synthesized light may be adjusted by adjusting the size of the quantum dot materials, thereby realizing the backlight requirements of a high color gamut (for example, 100% NTSC) liquid crystal display.

In addition, in the existing backlight module using the quantum dot technology, a quantum dot thin film is usually used. The quantum dot thin film is manufactured by encapsulating the quantum dots between two thin films. However, since the quantum dots are easily affected by moisture and oxygen, which may causes the quantum dots failure at the edge of the quantum dot thin film, it is very unfavorable for the display of the liquid crystal display.

SUMMARY

In order to solve the above-mentioned problems in the prior art, the purpose of the present disclosure is to provide a backlight module capable of preventing the quantum dot materials from being affected by moisture and oxygen, and a liquid crystal display including the same.

In accordance with an aspect of the present disclosure, there is provided a backlight module, including: a transparent light guiding body having a light incidenceincidence side surface and a sealed accommodating cavity; a plurality of quantum dots accommodated in the accommodating cavity; and a light source disposed adjacent to the light incidence side surface.

Furthermore, the transparent light guiding body includes a first transparent flat plate and a second transparent flat plate disposed to face each other with an interval, the first transparent flat plate and the second transparent flat plate have ends connected to each other to form the accommodating cavity between the first transparent flat plate and the second transparent flat plate, and side surfaces of the first transparent flat plate and the second transparent flat plate at the same side form the light incidence side surface.

Furthermore, the ends of the first transparent flat plate and the second transparent flat plate are connected together through a method of laser melting.

Furthermore, the first transparent flat plate and/or the second transparent flat plate are made of glass.

Furthermore, the first transparent flat plate has recesses and protrusions on a surface of the first transparent flat plate being far away from the second transparent flat plate.

Furthermore, the second transparent flat plate has dots on a surface of the second transparent flat plate being far away from the first transparent flat plate.

Furthermore, the backlight module further includes: a reflective sheet disposed to face a surface of the second transparent flat plate being far away from the first transparent flat plate.

Furthermore, the light source is a blue light LED, and the plurality of quantum dots are used to convert blue light emitted from the light source into white light.

In accordance with another aspect of the present disclosure, there is also provided a liquid crystal display, including a liquid crystal panel and a backlight module disposed opposite to each other, and the backlight module is the above backlight module.

Furthermore, the liquid crystal panel includes: an array substrate disposed over a first transparent flat panel; a color film substrate disposed over the array substrate, and the color film substrate and the array substrate being assembled by cell aligning; and a liquid crystal disposed between the array substrate and the color film substrate that are assembled by cell aligning.

The advantageous effect of the present disclosure is as follows: the present disclosure prevents the quantum dot material from being affected by moisture and oxygen by sealing the quantum dot materials using glass flat plates, thereby facilitating the display of the liquid crystal display.

BRIEF DESCRIPTION OF THE DRAWINGS

The above and other aspects, features and advantages of embodiments of the present disclosure will become more apparent, by the following descriptions taken in conjunction with the accompanying drawings, in which.

DETAILED DESCRIPTION OF EXEMPLARY EMBODIMENTS

Figure 1:
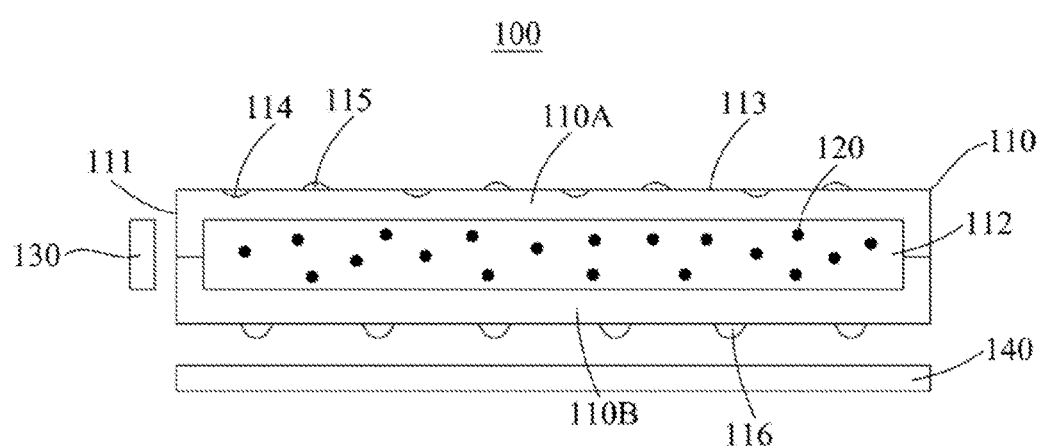
FIG. 1 is a structural schematic diagram of a backlight module according to an embodiment of the present disclosure.

Embodiments of the present disclosure will be described in detail below by referring to the accompany drawings. However, the present disclosure may be embodied in different forms and should not be construed as limited to the specific embodiments set forth herein. Rather, these embodiments are provided for explaining the principle and actual application of the present disclosure, so that those skilled in the art would understand various embodiments of the present disclosure and modifications which are suitable for specific intended applications.

In the drawings, thicknesses of the layer and the region are exaggerated for clarity of the device, wherein like reference numerals may be used to indicate the like elements throughout the description and the drawings.

FIG. 1 is a structural schematic diagram of a backlight module according to an embodiment of the present disclosure.

Referring to FIG. 1, a backlight module 100 according to the embodiment of the present disclosure includes: a transparent light guiding body 110, a plurality of quantum dots 120 and a light source 130. It shall be noted that, the backlight module 100 according to the embodiment of the present disclosure may also include a back frame, a sealant and other necessary components.

The transparent light guiding body 110 has a light incidence side surface 111 and a sealed accommodating cavity 112, the plurality of quantum dots 120 are accommodated in the accommodating cavity 112, and the light source 130 is disposed adjacent to the light incidence side surface 111. As such, the light emitted from the light source 130 enters the accommodating cavity 112 through the light incidence side surface 111, and the plurality of quantum dots 120 in the accommodating cavity 112 can convert a light entering the accommodating cavity 112 into white light.

Particularly, the transparent light guiding body 110 includes a first transparent flat plate 110A and a second transparent flat plate 110B. The first transparent flat plate 110A and the second transparent flat plate 110B are disposed to face each other, and the first transparent flat plate 110A and the second transparent flat plate 110B facing each other have an interval of a certain distance therebetween. Ends (ends at the circumference) of the first transparent flat plate 110A and the second transparent flat plate 110B are connected in sealing to seal the interval between the first transparent flat plate 110A and the second transparent flat plate 110B to be the accommodating cavity 112, and outer side surfaces of the first transparent flat plate 110A and the second transparent flat plate 110B at the same side (or the same end) are connected to form the light incidence side surface 111.

In addition, in the present embodiment, the surface of the first transparent flat plate 110A being far away from the second transparent flat plate 110B is set as a light emitting surface 113. The plurality of quantum dots 120 convert the light entering the accommodating cavity 112 into white light, and the white light is emitted through the light emitting surface 113.

In the present embodiment, the first transparent flat plate 110A and/or the second transparent flat plate 110B are made of a transparent glass, but the present disclosure is not limited thereto. For example, the first transparent flat plate 110A and/or the second transparent flat plate 110B may also be made of a transparent resin.

In addition, in order to ensure a good sealing performance of the sealing connection of the ends of the first transparent flat plate 110A and the second transparent flat plate 110B, in the present embodiment, preferably, the ends of the first transparent flat plate 110A and the second transparent flat plate 110B are connected together by using a method of laser melting. The well sealed first transparent flat plate 110A and second transparent flat plate 110B may isolate the moisture and oxygen in the surrounding environment from entering the accommodating cavity 112 to the maximum extent, thereby protecting the quantum dots 120. It should be understood that, as another embodiment of the present disclosure, other connection means (such as bonding, etc.) may also be used to connect the ends of the first transparent flat plate 110A and second transparent flat plate 110B.

Furthermore, the first transparent flat plate 110A has a plurality of grooves 114 and a plurality of protrusions 115 on the surface (i.e., the light emitting surface 113) of the first transparent flat plate 110A being far away from the second transparent flat plate 110B. The grooves 114 and the protrusions 115 may be formed by using a method of chemical etching or spray coating, but the present disclosure is not limited thereto. When the formed white light is emitted from the light emitting surface 113, the grooves 114 and the protrusions 115 may scatter the emitted white light, thereby improving the uniformity of the emitted light.

Furthermore, the second transparent flat plate 110B has a plurality of dots 116 on the surface of the second transparent flat plate 110B being far away from the second transparent flat plate 110A. In the present embodiment, the dots 116 may be formed by using a method of printing or laser. The setting of the dots 116 may destroy the light to form a total reflection in the accommodating cavity 112, thereby achieving the purpose of uniform light.

In addition, referring back to FIG. 1, a backlight module 100 according to the embodiment of the present disclosure further includes: a reflective sheet 140 disposed to face the surface of the second transparent flat plate 110B being far away from the second transparent flat plate 110A. As such, the reflective sheet 140 may reflect the light emitted from the surface of the second transparent flat plate 110B being far away from the second transparent flat plate 110A back into the accommodating cavity 112, thereby improving the light utilization efficiency.

In addition, in the present embodiment, a blue light LED is used as the light source 130. The plurality of quantum dots 120 may convert a blue light emitted from the blue light LED 130 into white light, but the present disclosure is not limited thereto.

Figure 2:
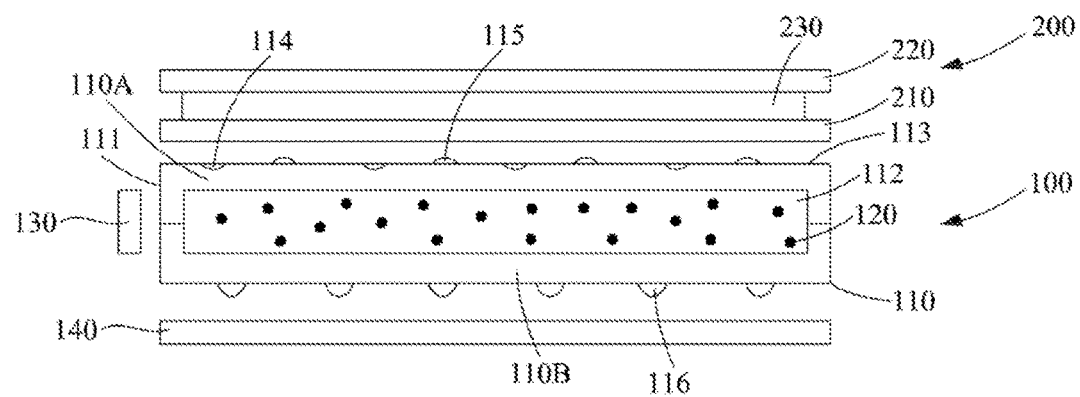
FIG. 2 is a structural schematic diagram of a liquid crystal display according to an embodiment of the present disclosure.

FIG. 2 is a structural schematic diagram of a liquid crystal display according to an embodiment of the present disclosure.

Referring to FIG. 2, the liquid crystal display according to the embodiment of the present disclosure includes a backlight module 100 as shown in FIG. 1 and a liquid crystal panel 200, which are disposed opposite to each other, and the backlight module 100 provides uniform display light to the liquid crystal panel 200 so as to allow the liquid crystal panel 200 to display an image.

The liquid display panel 200 includes a color film substrate (or color filter substrate) 210, an array substrate (or thin film transistor array substrate) 220 and a liquid crystal 230.

The array substrate 220 is disposed to face the light emitting surface 113. The array substrate 220 usually includes components such as thin film transistors and pixel electrodes arranged in an array, and the like.

The color film substrate 210 is disposed over the array substrate 220, and the color film substrate 210 and the array substrate 220 are assembled by cell aligning. The color film substrate 210 usually includes components such as a color filter, a black matrix, and the like.

The liquid crystal 230 is arranged between the color film substrate 210 and the array substrate 220 assembled by cell aligning.

In conclusion, the backlight module and the the liquid crystal display according to the embodiment of the present disclosure prevent the quantum dot material from being affected by moisture and oxygen by sealing the quantum dot materials using glass flat plates, thereby facilitating the display of the liquid crystal display.

Although the present disclosure has been described with reference to specific exemplary embodiments, those skilled in the art will understand that various changes in form and details may be made therein without departing from the spirit and scope of the invention as defined by the appended claims and its equivalents.

What is claimed is:

1. A backlight module for a liquid crystal panel, the backlight module comprising:
   a transparent light guiding body having a light incidence side surface, a sealed accommodating cavity, and a light emitting upper surface;
   a plurality of quantum dots accommodated in the accommodating cavity; and
   a light source disposed adjacent to the light incidence side surface,
   wherein the transparent light guiding body comprises a first transparent flat plate and a second transparent flat plate disposed to face each other with an interval, the first transparent flat plate and the second transparent flat plate are connected to each other around an entire circumference to form the accommodating cavity between the first transparent flat plate and the second transparent flat plate, and the first transparent flat plate and the second transparent flat plate are made of a same material, and
   wherein the transparent light guiding body of the backlight module has a substantially same size as the liquid crystal panel to allow light emitted from the light source to be incident to the transparent light guiding body through the light incidence side surface and to exit the transparent light guiding body through the light emitting upper surface and enter the liquid crystal panel.

2. The backlight module of claim 1, wherein side surfaces of the first transparent flat plate and the second transparent flat plate at the same side form the light incidence side surface.

3. The backlight module of claim 2, wherein the circumference of the first transparent flat plate and the second transparent flat plate are connected together through a method of laser melting.

4. The backlight module of claim 2, wherein the first transparent flat plate and the second transparent flat plate are made of glass.

5. The backlight module of claim 2, wherein the first transparent flat plate has recesses and protrusions on a surface of the first transparent flat plate being far away from the second transparent flat plate.

6. The backlight module of claim 2, wherein the second transparent flat plate has dots on a surface of the second transparent flat plate being far away from the first transparent flat plate.

7. The backlight module of claim 2, further comprising a reflective sheet disposed to face a surface of the second transparent flat plate being far away from the first transparent flat plate.

8. The backlight module of claim 6, further comprising a reflective sheet disposed to face the surface of the second transparent flat plate being far away from the first transparent flat plate.

9. The backlight module of claim 1, wherein the light source is a blue light LED, and the plurality of quantum dots are used to convert blue light emitted from the light source into white light.

10. A liquid crystal display, comprising:
    a liquid crystal panel; and
    a backlight module disposed under the liquid crystal panel, wherein the backlight module comprises:
       a transparent light guiding body having a light incidence side surface, a sealed accommodating cavity, and a light emitting upper surface;
       a plurality of quantum dots accommodated in the accommodating cavity; and
       a light source disposed adjacent to the light incidence side surface,
       wherein the transparent light guiding body comprises a first transparent flat plate and a second transparent flat plate disposed to face each other with an interval, the first transparent flat plate and the second transparent flat plate are connected to each other around an entire circumference to form the accommodating cavity between the first transparent flat plate and the second transparent flat plate, and the first transparent flat plate and the second transparent flat plate are made of a same material,
    wherein the transparent light guiding the body of the backlight module has a substantially same size as the liquid crystal panel to allow light emitted from the light source to be incident to the transparent light guiding body through the light incidence side surface and to exit the transparent light guiding body through the light emitting upper surface and enter the liquid crystal panel, and
    wherein the transparent light guiding body of the backlight module is disposed under the liquid crystal panel.

11. The liquid crystal display of claim 10, wherein side surfaces of the first transparent flat plate and the second transparent flat plate at the same side form the light incidence side surface.

12. The liquid crystal display of claim 11, wherein the liquid crystal panel comprises:
    an array substrate disposed over the first transparent flat plate;
    a color film substrate disposed over the array substrate, and the color film substrate and the array substrate being assembled by cell aligning; and
    a liquid crystal disposed between the array substrate and the color film substrate that are assembled by cell aligning.

* * * * *